(12) United States Patent
Beale et al.

(10) Patent No.: US 7,558,936 B2
(45) Date of Patent: Jul. 7, 2009

(54) DATA MANAGEMENT IN LONG RECORD LENGTH MEMORY

(75) Inventors: Terrance R. Beale, Portland, OR (US); Steven K. Sullivan, Beaverton, OR (US); Kristie L. Veith, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 93 days.

(21) Appl. No.: 11/388,926

(22) Filed: Mar. 24, 2006

(65) Prior Publication Data

US 2007/0226406 A1    Sep. 27, 2007

(51) Int. Cl.
*G06F 12/00* (2006.01)
(52) U.S. Cl. ......................... 711/171; 711/154; 711/170
(58) Field of Classification Search .................. None
See application file for complete search history.

(56) References Cited

U.S. PATENT DOCUMENTS 5,929,838 A     7/1999   Hall
7,120,259 B1 *  10/2006  Ballantyne et al. ....... 381/71.12

\* cited by examiner

*Primary Examiner*—Reginald G Bragdon
*Assistant Examiner*—Shawn X Gu
(74) *Attorney, Agent, or Firm*—Francis L. Gray; Thomas F. Lenihan

(57) ABSTRACT

A data management method for a long record length memory that is used for data acquisition writes data samples into an initial circular buffer within the memory having a size equal to a pre-trigger time. When a first trigger event occurs, the data samples are then written into a linear region after the circular buffer within the memory. The data sample acquisition in the linear region continues until a post-trigger and new pre-trigger time have elapsed after a last trigger event, at which point the acquisition terminates and the new pre-trigger time becomes a new circular buffer for a next trigger event. In this way all trigger events are captured with associated pre-trigger and post-trigger data.

5 Claims, 2 Drawing Sheets

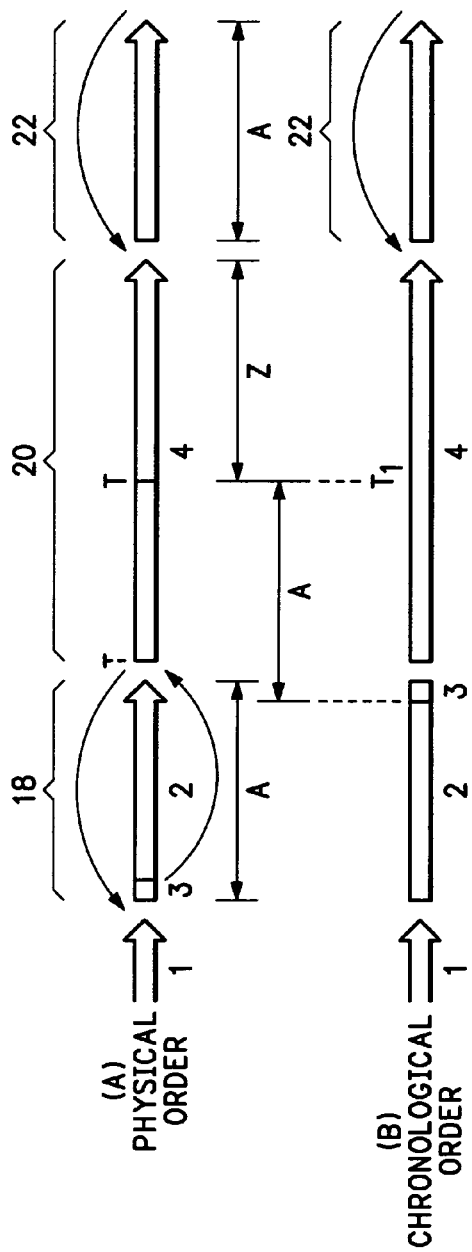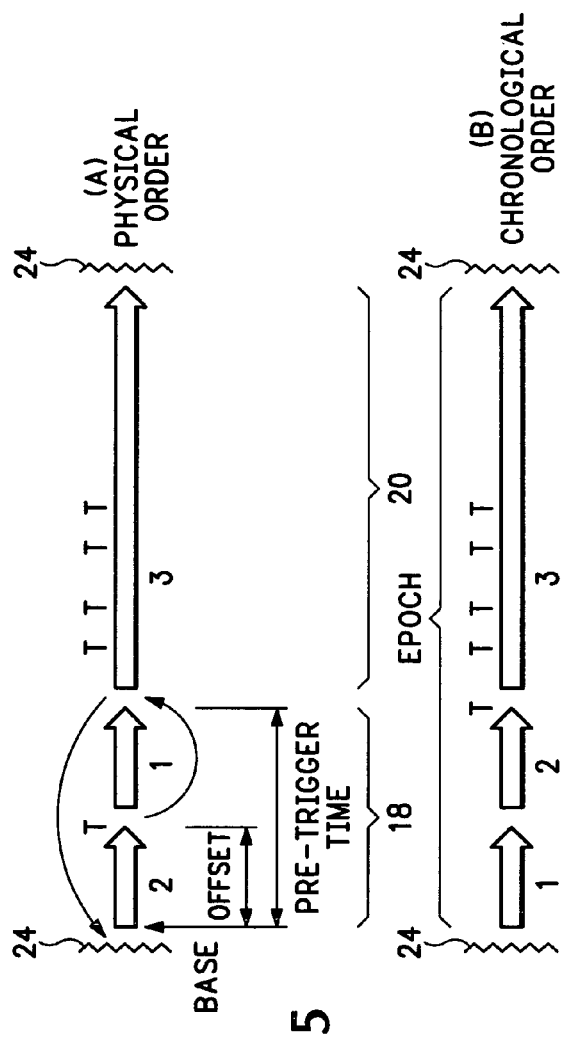

DATA MANAGEMENT IN LONG RECORD LENGTH MEMORY

BACKGROUND OF THE INVENTION

The present invention relates to data acquisition, and more particularly to a method of data management in a long record length memory.

Typically digital measurement instruments, such as digital oscilloscopes, place digitized data acquired from an input electrical signal into an acquisition memory for later processing. The acquisition memory is typically divided into two buffers with data being written into the two buffers in an alternating fashion. This insures that at least one buffer contains a valid data record at any time. When data is first written into one of the buffers, triggers that initiate acquisition of the data are disabled. The triggers are not enabled again until a pre-trigger amount of data has been written into the buffer. The pre-trigger data is needed so that a portion of the electrical signal waveform before a trigger event may be drawn on the screen of a display device. Writing continues in a circular fashion in the buffer until the trigger event occurs, and then continues until a post-trigger amount of data is written into the buffer. This insures that the buffer contains data surrounding the trigger event. At this point writing may start in the other buffer, with the first buffer containing acquired data relating to the trigger event for further processing and/or display.

A disadvantage of this double buffer approach is that trigger events are ignored during the time that the pre-trigger data is being written into the buffer. As memory becomes larger, it becomes more desirable to have longer pre-trigger times, causing trigger events to be ignored for longer periods of time. In addition digital instruments are becoming faster and capable of processing trigger events at a high rate of speed. Having a data management scheme that causes trigger events to be ignored for long periods of time goes against the trend of being able to process trigger events at a very fast rate.

In many cases the size of the buffer may be specified. When short buffers are selected, the screen update rate is generally better, but the amount of detail that is viewable is limited. When long buffers are selected, the screen update rate is generally poorer since more data must be processed when making each waveform image, but the amount of detail that is viewable is better. Trigger events are ignored for both short and long buffer sizes during the pre-trigger time as data starts to fill each new buffer.

U.S. Pat. No. 5,929,838 entitled "Acquisition Manager and Method for Alternating Digital Oscilloscope Operation between Fast Update Rate and Long Record Length" describes a method for getting both a fast update rate and high detail. During normal operation the oscilloscope selects a shorter buffer size that results in a good update rate and just enough detail for the screen size. When a user stops the acquisition process, the oscilloscope selects a longer record length for the buffer and attempts to capture one additional record. If a trigger event occurs, this acquisition becomes the last acquisition and has the advantage of good detail. If a trigger event does not occur within a reasonable period of time, the previous record is used and the record has a lower amount of detail. One problem with this method may be a lack of triggers. For instance when a digital circuit fails to operate properly, it may stop generating a signal. The problem causing the failure is often found by examining the operation of the circuit right around the time when the signal stops. The oscilloscope is set to observe the signal and to use the signal as the trigger. However it is not possible to obtain a high resolution acquisition around the time that the signal stops because the oscilloscope only attempts to capture a long record after the user stops acquisition. By this time the circuit has failed, the signal has stopped and the oscilloscope is no longer receiving triggers.

Some digital instruments have the ability to retain many buffers of acquisition data, i.e., an expanded version of the double buffer scheme. Each buffer is divided into pre-trigger data and post-trigger data. As the data is first placed into a new buffer, trigger events are ignored until a pre-trigger amount of data has been written into the buffer. If a trigger is ignored during this time and there are no additional trigger events for a period of time, the data in the circular buffer is overwritten. When acquisition of the data is stopped, the last trigger event may have been ignored. Although the order in which the data is obtained is known, it is not possible to know how many trigger events are lost between each record.

What is desired is a data management scheme for a long data length memory that always captures the last trigger event with high detail and provides a complete record of trigger events.

BRIEF SUMMARY OF THE INVENTION

Accordingly the present invention provides a data management system for a long record length memory that guarantees that data acquisition records for the last N triggers are in the memory. The data management system writes realtime data samples into an initial circular buffer within the long record length memory, the circular buffer having a size equal to a pre-trigger time. When a first trigger event occurs, the data samples are then written into a linear region after the circular buffer within the long record length memory. The data sample acquisition in the linear region continues until a post-trigger and new pre-trigger time have elapsed after a last trigger event, at which point the acquisition terminates and the new pre-trigger time becomes a new circular buffer for a next trigger event. In this way all trigger events are captured with associated pre-trigger and post-trigger data.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 4 is a graphic diagrammatic view for a single, last trigger event in (a) physical order and (b) chronological order according to data management method of the present invention.

FIG. 5 is a graphic diagrammatic view in (a) physical order and (b) chronological order illustrating "epochs" for the data management method according to the present invention.

DETAILED DESCRIPTION OF THE INVENTION

Figure 1:
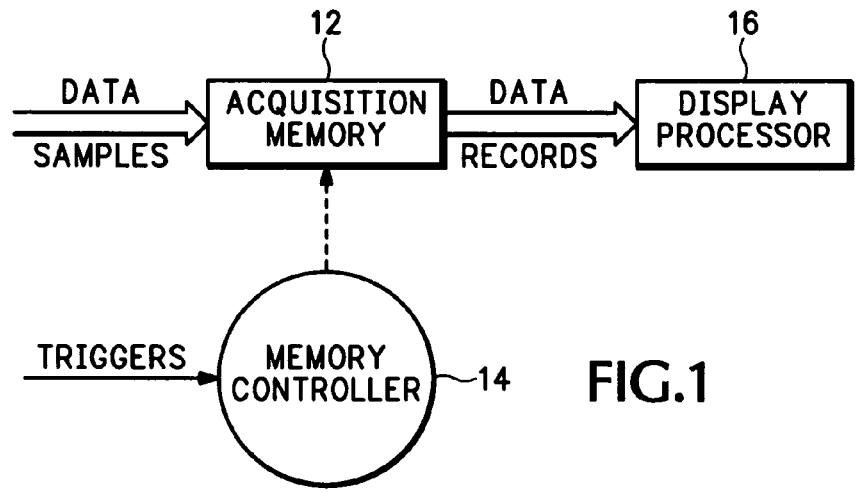
FIG. 1 is a simple block diagram view of a digital data acquisition instrument which uses the data management method according to the present invention.

Referring now to FIG. 1 a long record length memory 12 receives data samples, compressed or uncompressed, at an input. A memory controller 14 controls the long record length memory 12 as a function of received triggers, as is described below, to produce acquired data records. The acquired data records are then transferred from the long record length memory 12 to a display processor 16 to produce viewable data for a display. The viewable data may be in the form of waveform images when the acquired data records represent an electrical signal.

In the case of a digital oscilloscope the data samples are continuously written into the long record length memory 12 while data is being acquired. When data acquisition is initiated, trigger events are held off for an initial pre-trigger time. However subsequent trigger events do not have to be held off. The long record length memory 12 is considered to be circular, i.e., the first memory location follows the last memory location. Generally writing into the long record length memory 12 proceeds from lower memory addresses to higher memory addresses with occasional exceptions, as described below.

As writing progresses the data is organized into two forms—(i) circular buffers that contain a pre-trigger amount of data and (ii) linear stretches of data. The organization of these two forms of data within the long record length memory 12 depends on the rate at which trigger events arrive at the memory controller 14. As long as trigger events arrive at a fast enough rate, the long record length memory 12 is written in the linear mode. Only when a trigger event does not occur for a sufficiently long period of time is the long record length memory 12 written in the circular buffer again.

Figure 2:
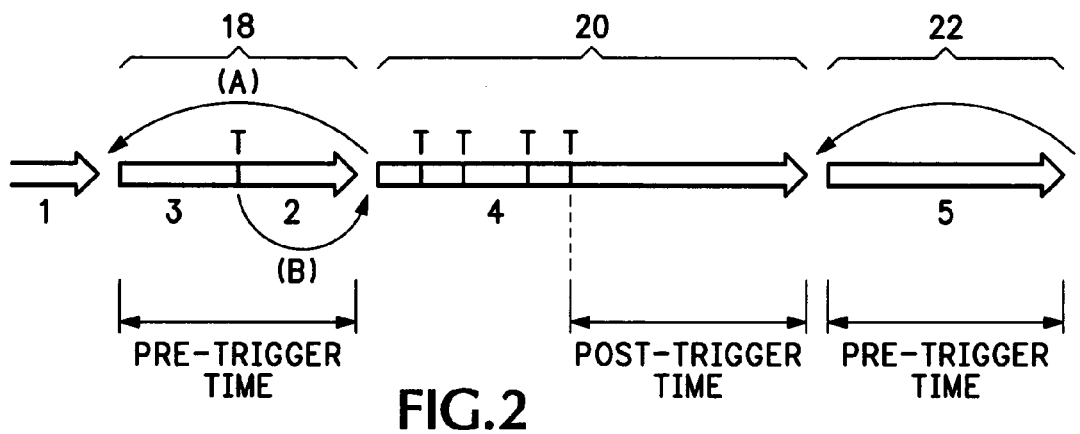
FIG. 2 is a graphic physical diagrammatic view of the data management method according to the present invention.

As shown in FIG. 2 a thick arrow represents the data in the long record length memory 12. A circular buffer 18 containing a pre-trigger amount of data is shown. The data is written into the circular buffer 18 from left to right until the end of the buffer is reached, at which time writing resumes at the left end of the buffer as indicated by the arrow (A). When a trigger event T is detected, the memory controller 14 causes the writing to immediately stop in the circular buffer 18 and resume in a linear region 20 to the right of the circular buffer, as indicated by the arrow (B). The data is now written in the linear mode until both a post-trigger amount of data and a pre-trigger amount of data are written without detecting a trigger event. When this occurs, the last pre-trigger amount of data becomes a new circular buffer 22 and writing continues in this circular buffer until a new trigger event occurs without overwriting the post-trigger data for the last prior trigger event.

Figure 3:
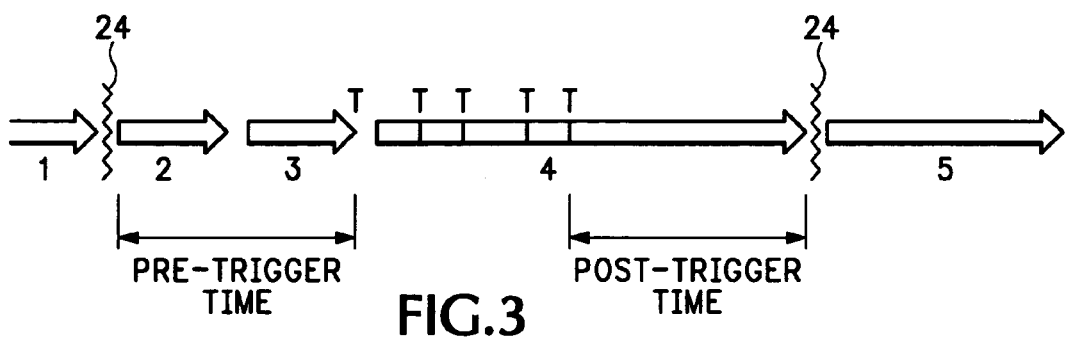
FIG. 3 is a graphic chronological diagrammatic view for FIG. 2 according to the present invention.

FIG. 3 shows the same acquisition data as in FIG. 2 in chronological order by unwrapping the first circular buffer 18. The jagged lines 24 indicate where data is lost when the contents of the circular buffers 18, 22 are overwritten due to no trigger events. This diagram clearly shows that there is always a pre-trigger amount of acquired data before every trigger, as well as a post-trigger amount of acquired data after every trigger. The result is that the acquired data is efficiently packed into the long record length memory 12, i.e., all acquired data is either part of the pre-trigger data or the post-trigger data for a trigger event. There is no time during which trigger events are ignored or discarded.

A traditional double buffer memory system holds acquired data around a single trigger event. The full memory size, M, is divided into two equal circular buffers so each buffer has a size M/2. Each buffer must hold the pre-trigger data A and the post-trigger data Z, i.e., A+Z=M/2, so that a full data record (A+Z) for a trigger event is only as large as half the memory size (M/2). Referring now to FIG. 4 the largest usable amount of the long record length memory 12 for looking at a single or last trigger event of a sequence of trigger events is shown according to the data management method of the present invention. The desired single trigger event occurs in the linear buffer 20 close enough to the preceding circular buffer 18 so that the circular buffer is still used. Further the data in the circular buffer 18 is organized so that the oldest data is at the start of the circular buffer, i.e., the first trigger that initiated a transition into the linear region 20 occurred at one sample into the circular buffer (FIG. 4(a)). In this case one sample of the pre-trigger buffer 18 is still required to complete the pre-trigger time for the desired trigger event and is maintained (FIG. 4(b)). Therefore almost two amounts of pre-trigger data (2A−1) precede the desired single trigger event T. Following the trigger event T is one amount of post-trigger data (Z) and, in the worst case, an additional circular buffer 22 of pre-trigger data (A) is used while waiting for a next trigger event. This results in the long record length memory 12 having (3*A−1)+Z, or approximately 3*A+Z=M. In the double buffered memory system the memory has to have two amounts of both the pre-trigger data and the post-trigger data 2*(A+Z) so each record length has a length of M/2. In the data management method of the present invention when the pre-trigger time is 0% of the record length, a record length of M may be achieved. This doubles the record length over the double buffered memory system. When pre-trigger time is 50% of the record length, the achievable record length is M/2, which is equivalent to the double buffered memory system. When pre-trigger time is 100%, the achievable record length is reduced to M/3.

When N full records are desired instead of a single record, the most memory is used when trigger events occur at a slow rate so that every trigger event is preceded with the pre-trigger amount of data and followed with the post-trigger amount of data. The oldest trigger event requires 2*A−1 amount of the pre-trigger data. All others require at most A amount of the pre-trigger data. All trigger events require at most Z amount of the post-trigger data. In addition one additional circular buffer is required, so that (N+2)*A−1+N*Z=M. If the size of the long record length memory 12 is 1,000,000 samples and a full record is 10,000 samples long, for a full record of just pre-trigger data with the post-trigger data size set to zero: (N+2)*10,000−1=1,000,000; i.e., 98 full records may be held in the long record length memory. If the pre-trigger data size is zero and the record is just post-trigger data, then 100 full records may be held in the long record length memory 12. In practice both the pre-trigger and post-trigger data regions may be made longer than the effective amount to allow for some extra data at both ends of each record. The number of trigger events held in the long record length memory 12 may be much larger than the amount calculated above. This occurs when the time between trigger events is less than the sum of the pre-trigger time and the post-trigger time.

The above discussion illustrates the general organization of data in the long record length memory 12. Unlike traditional acquisition memories that are divided into two fixed buffers, the long record length memory 12 is broken into regions that vary depending on how trigger events occur. In order to retrieve acquired data from the long record length memory 12, two additional types of data are required: (i) data that describes the order in which data has been stored into the long record length memory and (ii) data that holds information about the trigger events.

Acquired data is stored in the long record length memory 12 as "epochs." Each epoch starts with the circular buffer 18 and ends with the linear region 20, as shown in FIG. 5. The entire long record length memory 12 is treated as being circular so an epoch may leave the high end of the memory and continue in the low end of the memory, although not shown here for clarity. Each epoch starts at a "base" location in the long record length memory 12. All locations within the epoch are found by adding a value to the base. Note that a memory address that is past the end of the long record length memory 12 is wrapped back to the start of the long record length memory.

While writing data samples into the circular buffer 18 at the start of the epoch, the first trigger causes the writing to stop at the current location and to resume after the end of the circular buffer. When the first trigger occurs, the next location in the circular buffer 18 that would have been written if the trigger had not occurred is saved by the memory controller 14 as an "offset", i.e., the offset is the location of the oldest data in the circular buffer for the epoch. Writing linearly into the linear region 20 of the epoch continues as long as there are triggers, or until the post-trigger amount of data plus the pre-trigger amount of data are written without another trigger event. When this occurs, writing into the long record length memory 12 jumps back a pre-trigger amount of data to the start of a circular buffer at the base or start of a new epoch. To read data in the epoch, reading starts at the offset location and proceeds to the end of the circular buffer 18, defined by the amount of the pre-trigger data. Data is then read from the base of the epoch and proceeds to the offset. The remaining data is read by starting after the pre-trigger data up to the base of the next epoch. The base and offset for each epoch are maintained in an epoch circular list.

If the first trigger in an epoch occurs at the very end of the circular buffer 18, the offset is zero and the data in the epoch is in the proper chronological order. When trigger events continue at a frequent rate and the entire memory becomes a single linear region, there is a single epoch and the circular buffer 18 at the start of the epoch is overwritten. When this occurs, the offset of the epoch is set to zero to indicate that all of the long record length memory 12 is linear. When stopping, the next location to be written is stored as the oldest sample, or location at which the linear region 20 begins.

When only a single record is desired, only the information about the epoch containing the last trigger is saved. However when information about many trigger events is needed, information about a number of epochs is saved in the epoch circular list. Each entry in the list describes an epoch by holding the base address and the offset, as indicated above. A pointer into the epoch circular list identifies the current epoch. There may be other data stored in the epoch list, such as a time stamp, allowing the time between epochs to be known.

A trigger data circular list is used to keep track of a number of trigger events. There is a pointer that points to the entry in the list that holds data about the next trigger event. When starting an acquisition, the pointer is set to point to the first entry in the trigger data circular list and a flag is cleared to indicate that the circular list is not full. After enough trigger events have occurred to cause the pointer to wrap back to the top of the trigger data circular list, this flag is set to indicate that the trigger data circular list is full. When a trigger event occurs, data that identifies the trigger event is entered into the trigger data circular list and the list pointer is advanced to the next item. The trigger data includes the epoch number and position within the epoch. The epoch number is the index into the epoch circular list. The epoch information identifies the start of the epoch in the long record length memory 12 and enables finding the full record relating to each trigger event within the epoch. Some additional information may be stored in each entry in the trigger data circular list.

In dynamic random access memory (DRAM) technology data is written in bursts of multiple bytes representing a packet or block of data samples. Therefore each address in the long record length memory 12 corresponds to a packet or block of acquired data. When this is the case, additional data is stored in the trigger data circular list to identify the trigger position within the packet or block. The time of the trigger event is sometimes measured with a resolution that is better than the sample rate of the data being stored in the long record length memory 12. When this is the case, the extra resolution may be stored in the trigger data circular list. A time stamp may also be stored. In the special case where only information about a single trigger event is desired, the trigger data circular list is not needed and the desired information is kept in a register.

In practice there are three modes of operation. In the first mode a single record is captured. In the second mode acquired data corresponding to a number of sequential trigger events is captured. In the third mode data for packets of varying length is captured.

When capturing a record of a single trigger event, the size of the pre-trigger data and post-trigger data is programmed so that $3*A+Z$ is less than the available memory size M. When the acquisition process is started, trigger events are initially disabled during the very first pre-trigger interval, as described above. Thereafter trigger events may be allowed at a relatively high rate determined by the slowest of the trigger system speed, the rate at which data may be placed into the trigger data circular list, or by a holdoff time specified by the user to limit the trigger acceptance rate. When the instrument is in a single sequence mode, the first accepted trigger event causes the acquisition process to be halted after the post-trigger data has been acquired. Only the first trigger event is retained. In any case acquisition is halted after a stop command but, if a trigger event has been recognized and the post-trigger data for that trigger event is not finished being acquired, the acquisition is extended until the end of the post-trigger period.

When capturing a series of sequential trigger events, the pre-trigger data and post-trigger data are programmed so that $(N+2)*A+N*Z$ is less than the available memory size M, also as described above. When the acquisition process is started, trigger events are initially disabled during the very first pre-trigger interval. Thereafter trigger events may be allowed at a relative high rate determined by the slowest of the trigger system speed, the rate at which data may be placed into the trigger data circular list, or by a holdoff time specified by the user to limit the trigger acceptance rate. If the instrument is in a single sequence mode, after accepting N trigger events it ignores additional trigger events and stops the acquisition. In any case acquisition is halted after a stop command. The actual acquisition of data is extended to the end of the post-trigger time of the last accepted trigger.

Some forms of data are sent in packets, i.e., USB and Ethernet data. Between the packets of information the data bus is idle. Capturing large amounts of an idle data from the data bus fills the long record length memory when what is desired is only the packets of information. The packets often come in many sizes. What is sometimes required is a triggering mode that captures all of the data in the packets while not capturing idle data over long stretches of time when the data bus is idle. The data management system for the long record length memory allows packets to be acquired, even though the packets are of varying sizes, while excluding almost all of the idle time. To capture the packets the trigger is set to trigger on the transition of the data in a packet. The data within packets always transitions at least at some minimum rate. The pre-trigger and post-trigger times are set to be longer than the time the data may stay in any state. During a packet the continual changing of the data keeps generating triggers, causing the entire packet to be acquired during one epoch. Once the end of the packet is reached, the data bus becomes idle, triggers are no longer generated and the epoch comes to an end. A circular buffer is created at the start of the new epoch and data samples are discarded up to the beginning of the next packet. In packet capture mode only the first trigger event in each epoch is stored in the trigger data circular list. Records are a variable length. The record of the packet starts at the beginning of the epoch and goes to the end of the epoch. In single sequence mode the memory controller 14 may be programmed to capture data until a certain number of packets have been acquired or when the long record length memory 12 is full or nearly full. At this point acquisitions are stopped. The last packet may not be complete. In any case acquisitions are halted after a stop command, extended to the end of the post-trigger time.

There are a number of considerations to consider. When halting acquisitions in the middle of a packet, another epoch is written into the epoch circular memory. The next entry defines the end of the current epoch. In the case of a very long packet or when the data is continuous, the long record length memory 12 may be filled with data and the start of the epoch may be overwritten. In this case there are no complete packets to display. When halting the acquisition, the epoch circular list may be modified so that the base of the current epoch is near the oldest acquired data in the long record length memory 12. If the packet length is short and the memory length is long, it is possible to overflow the trigger data circular list or the epoch circular list. In single sequence mode the acquisition may stop before either of these lists overflow even if the long record length memory 12 is not full. If these lists do overflow, care is taken to insure that only legitimate acquisition data is displayed. In packet mode there is one epoch for each trigger so special logic is needed if the epoch circular list is shorter than the trigger data circular list.

Thus the present invention provides a data management method for a long record length memory by managing the placement of data in the long record length memory using a circular buffer within the memory during a pre-trigger time and jumping to a linear region at the end of the circular buffer within the memory when a first trigger event occurs until both post-trigger and pre-trigger times expire after a last trigger event occurs.

What is claimed is:

1. A method of data management for a memory for use in a digital oscilloscope, comprising the steps of:
   setting a first number of memory locations of a circular buffer of said memory for storing pre-trigger data in response to input by a user;
   setting a second number of memory locations of a linear region of said memory for storing post-trigger data in response to input by a user;
   writing data samples into said circular buffer within the memory until a first trigger event occurs;
   writing data samples into the linear region located after the circular buffer within the memory when said first trigger event occurs; and
   stopping writing of data samples into the linear region when an amount of data samples equal to the sum of the first number of memory locations and the second number of memory locations are written into the linear region after a last trigger event occurs.

2. The method as recited in claim 1 wherein memory locations corresponding to the start of the circular buffer through the second number of memory locations after the last trigger event comprise an epoch.

3. The method as recited in claim 2 further comprising the step of reading out the epoch from the memory in chronological order starting at a point in the circular buffer following the first trigger event to the end of the circular buffer, then from the beginning of the circular buffer to the first trigger event, and finally from the beginning of the linear region to the end of the second number of memory locations.

4. The method as recited in claim 2 further comprising the step of maintaining an epoch circular list containing indices to the beginning of each epoch within the memory.

5. The method as recited in claim 4 further comprising the step of maintaining a trigger data circular list containing indices to each trigger event within each epoch.

* * * * *